(12) United States Patent
Patrice

(10) Patent No.: US 7,494,068 B2
(45) Date of Patent: *Feb. 24, 2009

(54) CONTACTLESS TRANSPONDER

(75) Inventor: Philippe Patrice, Allauch (FR)

(73) Assignee: Gemalto SA, Gemenos (FR)

( * ) Notice: Subject to any disclaimer, the term of this patent is extended or adjusted under 35 U.S.C. 154(b) by 0 days.

This patent is subject to a terminal disclaimer.

(21) Appl. No.: 11/785,407

(22) Filed: Apr. 17, 2007

(65) Prior Publication Data

US 2007/0187518 A1    Aug. 16, 2007

Related U.S. Application Data

(62) Division of application No. 11/244,373, filed on Oct. 6, 2005, now Pat. No. 7,204,427, which is a division of application No. 09/623,796, filed on Sep. 8, 2000, now Pat. No. 6,957,481.

(30) Foreign Application Priority Data

Mar. 9, 1998    (FR)    .................. 98 02844

(51) Int. Cl.
G06K 19/06    (2006.01)
(52) U.S. Cl. .................. 235/492; 438/106; 438/613
(58) Field of Classification Search .................. 235/488; 257/679; 361/737; 438/125
See application file for complete search history.

(56) References Cited

U.S. PATENT DOCUMENTS

| | | | |
|---|---|---|---|
| 5,057,458 A | 10/1991 | Hoeberechts et al. | |
| 5,528,222 A | 6/1996 | Moskowitz et al. | |
| 5,827,907 A | 10/1998 | Gotro et al. | |
| 5,856,662 A | 1/1999 | Kohama et al. | |
| 6,281,048 B1 | 8/2001 | Vere et al. | |
| 6,374,486 B1 | 4/2002 | Brechignac | |
| 6,404,643 B1 | 6/2002 | Chung | |
| 6,406,989 B1 | 6/2002 | Ikegami | |
| 6,435,415 B1 | 8/2002 | Catte | |
| 6,677,186 B1 | 1/2004 | Zafrany et al. | |
| 6,770,509 B2 | 8/2004 | Halope et al. | |
| 6,853,087 B2 | 2/2005 | Neuhaus et al. | |
| 6,957,481 B1 | 10/2005 | Philippe | |
| 7,204,427 B2* | 4/2007 | Patrice | 235/492 |
| 2002/0026703 A1 | 3/2002 | Oku et al. | |

FOREIGN PATENT DOCUMENTS

| | | |
|---|---|---|
| DE | 4431606 A1 | 3/1996 |
| FR | 2752077 | 2/1998 |
| JP | 1-129431 | 5/1989 |
| JP | 4-237066 | 8/1992 |
| WO | WO 96/07985 | 3/1996 |

* cited by examiner

*Primary Examiner*—Jared J. Fureman
(74) *Attorney, Agent, or Firm*—Buchanan Ingersoll & Rooney PC

(57) ABSTRACT

A contactless transponder includes an antenna made from a conductive material that is disposed on a surface of a substrate. An integrated circuit chip having electrical contacts is mounted on a surface of the antenna that is remote from the substrate. The contacts of the chip are embedded in the material of the antenna, and at least a portion of the chip protrudes above the surface of the plane defined by the remote surface of the antenna.

19 Claims, 1 Drawing Sheet

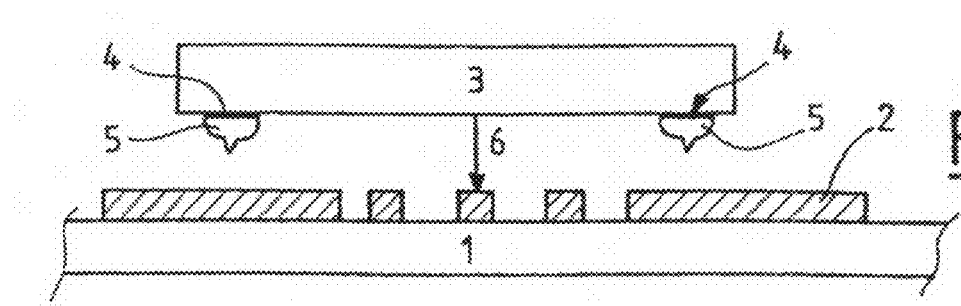
FIG_1a
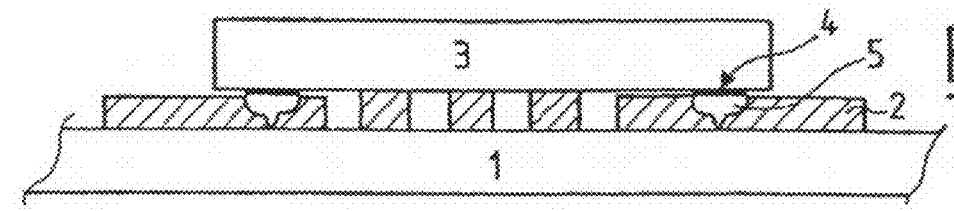
FIG_1b
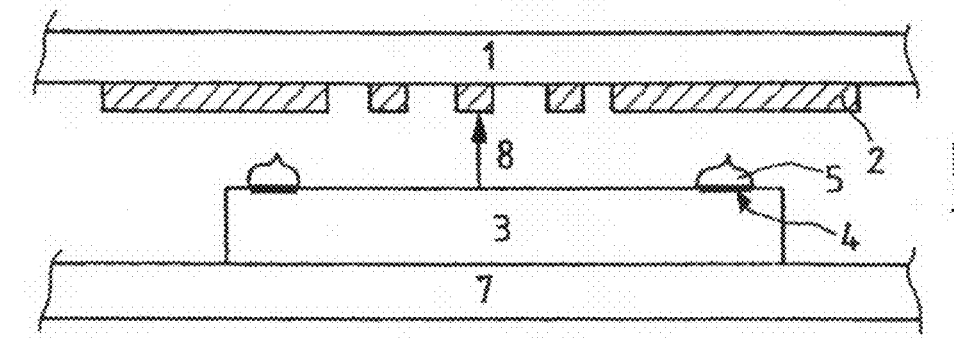
FIG_2a
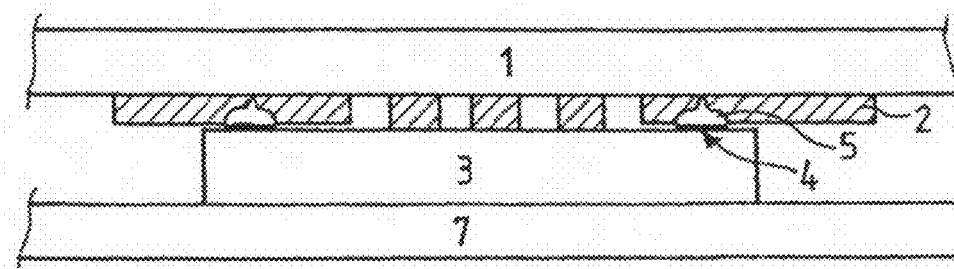
FIG_2b

CONTACTLESS TRANSPONDER

This application is a divisional of application Ser. No. 11/244,373 filed Oct. 6, 2005 now U.S. Pat. No. 7,204,427, which is a divisional of application Ser. No. 09/623,796 filed Sep. 8, 2000, now U.S. Pat. No. 6,957,481, which is a national filing of International Application No. PCT/FR99/00445, filed Feb. 26, 1999.

BACKGROUND OF THE INVENTION

The present invention relates to the manufacture of smart cards, and more particularly cards capable of functioning without contact by means of an antenna integrated into the card.

Such cards are intended for performing various operations such as, for example, banking operations, telephone communications, identification operations, operations of debiting or recharging units of account, and all kinds of operations which can be performed remotely by high-frequency electromagnetic coupling between a transmission/reception terminal and a card placed in the area of action of this terminal.

One of the main problems which it is necessary to resolve in the manufacture of such cards is the connection of the antenna to the integrated-circuit chip which provides the electronic functioning of the card. Another problem which it is necessary to resolve is the reduction of the thickness of the card as far as possible. The conventional constraints of mechanical strength, reliability and manufacturing cost must obviously be taken into account in this manufacture.

A known solution from the prior art, described in the document PCT WO 96/07985, for effecting the connection between the antenna and the integrated-circuit chip, consists of forming metallic protrusions on two contact pads on the chip, and then connecting these protrusions to the ends of an antenna wire. In this case, the antenna wire is a copper wire formed on a substrate and the protrusions are applied to this antenna wire by hot compression.

However, the interconnection unit thus obtained has problems of mechanical strength and tensile fragility of the connection. This is because, when the chip is subjected to mechanical stresses, the protrusions suffer damage affecting the quality of the electrical connection. The mechanical stresses can even go as far as causing the rupture of the protrusions and consequently the pulling away of the chip. The contactless smart cards produced according to this prior method therefore have a relatively short service life.

In another known solution from the prior art, the connection between the antenna and the chip is effected by means of conductive glue applied between the antenna and metallic protrusions formed on two contact pads on the chip. In this case, however, a significant excess thickness appears because of the presence of the glue and the protrusions. In addition, the manufacture of the card requires an additional step of dispensing the dots of glue.

The protrusions, and where applicable the dots of conductive glue, have a not insignificant thickness which is added to that of the antenna and that of the chip, which increases the bulk of the interconnection unit obtained. However, it is sought to obtain an interconnection unit of very small size in order to produce an ultraflat contactless smart card, that is to say with a thickness less than the standard ISO thickness.

SUMMARY OF THE INVENTION

The present invention makes it possible to resolve the problems encountered in the prior art since it proposes to manufacture a contactless smart card in which the chip is directly connected to the antenna by means of metallised protrusions which are embedded in the thickness of the antenna, at the time of attaching the chip to the antenna.

The object of the invention is more particularly a method of manufacturing a contactless chip card including an integrated-circuit chip and an antenna, in which metallised protrusions are produced on two contact pads on the chip, characterised in that the connection of the chip to the antenna is effected by embedding the metallised protrusions in the thickness of the antenna, at the time that the chip is attached to the said antenna.

By virtue of the method according to the invention, the connection obtained between the antenna and the chip is of very good quality. This is because, given that the metallised protrusions are embedded in the antenna, there is no risk of their being damaged, and even less being broken, when the card is subjected to mechanical stresses. The mechanical strength of the connection being improved, the contactless smart cards manufactured according to this method consequently have an increased service life.

In addition, given that the protrusions are embedded in the thickness of the antenna, the interconnection assembly formed by the chip and antenna has reduced bulk, which is very advantageous for producing an ultraflat card, with a thickness less than 760 m.

In addition, according to another characteristic of the invention, the antenna is produced from a material able to have a viscous state at the time the chip is attached, to allow the embedding of the metallised protrusions.

Thus the antenna can be produced from a thermoplastic material loaded with metallic particles and the chip is attached to the antenna by thermocompression. In this case, the heat softens the antenna material and the compression facilitates the penetration of the protrusions into the thickness of the softened material.

According to another embodiment, the antenna can be produced from a non-polymerised conductive material, and then the chip is attached to the antenna by compression, and an addition of heat polymerises the antenna material. In this case, before the attachment of the chip, the antenna being produced from a non-polymerised material, it has a soft appearance. The compression step then facilitates the penetration of the protrusions into the antenna material and the heating, for its part, polymerises the antenna material in order to harden it.

According to another embodiment, the antenna is produced from a moist conductive polymer material and the chip is attached to the antenna by compression. In this case, the polymer still being moist, it has a viscous appearance. Once the embedding of the protrusions has been effected by compression, drying in ambient air suffices to harden the polymer.

According to yet another embodiment, the antenna is produced from a thermoplastic material loaded with metallic particles, the chip is glued in advance to an insulating sheet to the format of the smart card to be produced, and then the connection of the chip to the antenna is effected by hot lamination. In this case also, the heat softens the antenna material whilst the lamination facilitates the penetration of the protrusions into the softened material.

BRIEF DESCRIPTION OF THE DRAWINGS

Other particularities and advantages of the invention will emerge from a reading of the description given by way of illustrative and non-limitative example and made with reference to the accompanying figures, which depict:

FIGS. 1a and 1b, diagrams in section of the mounting of a chip during its connection to an antenna, FIGS. 2a and 2b, diagrams in section of the mounting of a chip during its connection to an antenna, according to another embodiment.

DETAILED DESCRIPTION

FIGS. 1a and 1b depict a chip 3 during its mounting on an antenna 2. The interconnection assembly formed by the chip 3 and antenna 2 is intended to be inserted in a contactless smart card of ultrafine thickness less than the standard ISO thickness.

A preliminary step of the manufacturing method according to the invention consists of forming metallised protrusions 5 on contact pads 4 on the chip 3. The protrusions 5 are intended to provide the electrical connection between the chip 3 and antenna 2. They are consequently necessarily produced from a conductive material. They may for example be produced from gold, or from a polymer material loaded with metallic particles.

Preferably the protrusions 5 are produced on two contact pads 4 on the chip in order to be able to produce a connection on conductive areas of the antenna 2 situated at its ends.

Given that the protrusions 5 are intended to be embedded in the thickness of the antenna 2, they preferably have a thickness approximately equal to, or slightly less than, that of the antenna.

In addition, to allow good penetration of the protrusions 5 into the thickness of the antenna 2, a substantially conical shape is preferred for them.

The antenna 2, for its part, is produced on an insulating substrate 1. It is produced from a conductive material able to be softened at the time of attaching the chip 3, to allow better penetration of the protrusions 5. Its shape is of little importance, and may for example represent a spiral or any other pattern.

The insulating substrate 1 is for example a plastic sheet to the format of the smart card to be produced. It may for example be composed of polyvinyl chloride (PVC) or polyethylene (PE).

A first embodiment consists of producing the antenna 2 from a thermoplastic material loaded with metallic particles. This material is for example supplied by the company AIT under the reference LZTP 8550-FT. The antenna is formed in this case by screen-printing with conductive ink with a thermoplastic base. The metallic particles consist for example of small balls of silver. In this case, the subsequent step consisting of attaching the chip 3 to the antenna 2 is effected by hot compression 6. Heating in fact softens the thermoplastic material constituting the antenna 2, and the simultaneous compression facilitates the penetration of the protrusions 5 into the thickness of the antenna with a view to effecting the connection of the chip 3 to the antenna 2. When the thermocompression operation is terminated, the interconnection assembly obtained is left to cool at room temperature. Cooling enables the antenna material to regain its solid state and its initial shape. The thermoplastic antenna generally has adhesive properties during its softening which make it possible to fix the chip.

Another plastic sheet to the format of the smart card to be produced, not shown in FIGS. 1a and 1b, can then be applied to the top of the interconnection assembly obtained and fixed by gluing, in order to enclose the chip and antenna and thus form a contactless card.

By virtue of this manufacturing method, the connection of the chip 3 to the antenna 2, by embedding the protrusions 5 in the antenna 2, and the fixing of the chip 3 to the antenna 2, are effected in one and the same step.

In a variant embodiment, the antenna 2 is produced from a conductive thermosetting polymer material, that is to say one loaded with metallic particles. In this case, it is ensured that the antenna material is not polymerised before the step of attaching the chip to the antenna, so that this material is in a viscous state, for example between 8000 CPS and 6000 CPS. The chip 3 is then attached by compression 6, in order to facilitate the penetration of the protrusions 5 into the thickness of the antenna material. An addition of heat also polymerises the antenna material 2 so that it hardens. This heating operation can be carried out either after or simultaneously with the compression operation. In this case too, the electrical connection between the chip and the antenna and the fixing of the chip to the antenna are effected in a single step.

In another variant embodiment, the antenna 2 is produced from a conductive polymer material which has not been dried. In this case, the fact that the polymer is moist suffices for it to keep its soft appearance. The chip 3 can then be attached to the antenna 2 by compression 6 in order to facilitate the penetration of the metallised protrusions 5 into the thickness of the antenna material. It then suffices to leave the interconnection block obtained to dry in ambient air, so that the antenna material hardens. In this case, an addition of heat is then not necessary.

FIGS. 2a and 2b depict another embodiment of a mounting of a chip 3 connected to an antenna 2. In these figures the same references as in FIGS. 1a and 1b have been repeated in order to designate the same elements. In this embodiment, the antenna 2 is also produced on an insulating substrate 1, such as a plastic sheet for example, to the format of the smart card to be produced. The antenna 2 is produced from a thermoplastic material loaded with metallic particles. Metallised protrusions 5 are also formed on the contact pads 4 on the chip 3.

However, this embodiment differs from the previous ones by the fact that the step of attaching the chip 3 to the antenna 2 is not carried out in the same way.

This is because, in the example in FIGS. 2a and 2b, an additional preliminary step consists of gluing the chip 3 to an insulating substrate 7. This substrate 7 is for example a plastic sheet made of polyvinyl chloride (PVC) or polyethylene (PET) to the format of the card which it is wished to produce. In this case, the non-active rear face of the chip 3, that is to say the face opposite to the one which carries the contact pads 3 and metallised protrusions 5, is therefore glued to the substrate 7.

Thus the chip 3 and antenna 2 are disposed between two plastic sheets 1 and 7, preferably produced to the format of the card which it is wished to manufacture.

The attaching of the chip 3 to the antenna 2 and the electrical interconnection are then effected during an operation of hot lamination 8 of the two plastic sheets 1 and 7. The heat in fact softens the thermoplastic material constituting the antenna whilst the lamination, consisting of pressing the two plastic sheets 1 and 7 against each other, facilitates the penetration of the protrusions 5 into the softened antenna material.

When the hot lamination operation is terminated, the interconnection assembly obtained is left to cool so that the antenna material 2 regains its initial solid state. The chip 3 and antenna 2 are then connected and enclosed between two plastic sheets 1 and 7, thus forming a contactless smart card.

By virtue of the manufacturing method according to the invention, it is possible to manufacture contactless smart cards with ultrafine thickness less than 760 m. The thickness of the card obtained is in fact equal to the sum of the thicknesses of the two plastic sheets 1 and 7, chip 3 and antenna 2. Orders of magnitude of these thicknesses are given below for purely illustrative purposes. The antenna 2 can be produced on a thickness of between 20 and 30 m, the integrated-circuit chip 3 can be produced on a thickness of less than 300 m and the plastic sheets 1 and 7 can be produced on a thickness of between 40 and 100 m.

In addition, the protrusions 5 being completely embedded in the thickness of the antenna 2, there is no risk of their being damaged by mechanical stresses. The interconnection assembly obtained therefore has very good mechanical strength and increased service life.

What is claimed is:

1. A contactless transponder, comprising:
    a substrate having a planar surface;
    an antenna made from a conductive material disposed on said substrate, said antenna having a surface remote from said substrate that defines a plane parallel to said planar surface of said substrate; and
    a chip structure comprising an integrated circuit chip and electrical contacts, said chip structure being mounted on said surface of said antenna such that a portion of said chip structure is embedded in the material of said antenna, and at least a portion of said integrated circuit chip protrudes above said surface of said antenna.

2. The transponder of claim 1, wherein said conductive material comprises a thermoplastic material having metallic particles dispersed therein.

3. A contactless transponder, comprising:
    an insulating substrate having a planar surface;
    an antenna made from a conductive material disposed on said substrate, said antenna having a surface remote from said substrate that defines a plane parallel to said planar surface of said substrate; and
    an integrated circuit chip having a surface with contacts thereon,
    wherein said chip is mounted on said surface of said antenna such that at least a portion of said chip protrudes above the plane defined by said surface of said antenna and said contacts are embedded in the material of said antenna.

4. The transponder of claim 3, wherein said contacts include bumps that protrude from said surface of the chip and are embedded in the material forming said antenna.

5. The transponder of claim 4, wherein said bumps have a substantially conical shape.

6. The transponder of claim 3, wherein said conductive material comprises a thermoplastic material having metallic particles dispensed therein.

7. The transponder of claim 3, wherein said conductive material comprises a conductive polymer.

8. The transponder of claim 7, wherein said conductive polymer comprises a thermosetting polymer having metallic particles dispersed therein.

9. The transponder of claim 7, wherein said conductive polymer comprises a thermoplastic material having metallic particles dispersed therein.

10. A contactless transponder, comprising:
    an insulating substrate having a planar surface;
    an antenna made from a conductive polymer disposed on said substrate, said antenna having a surface remote from said substrate that defines a plane parallel to said planar surface of said substrate; and
    a chip structure comprising an integrated circuit chip and electrical contacts, said chip structure being mounted on said surface of said antenna such that a portion of said chip structure is embedded in the material of said antenna, and at least a portion of said integrated circuit chip protrudes above said surface of said antenna.

11. The transponder of claim 10, wherein said conductive polymer comprises a thermosetting polymer having metallic particles dispersed therein.

12. The transponder of claim 10, wherein said conductive polymer comprises a thermoplastic material having metallic particles dispersed therein.

13. A contactless transponder, comprising:
    a substrate having a planar surface;
    an antenna made from a conductive material disposed on said substrate, said antenna having a surface remote from said substrate that defines a plane parallel to said planar surface of said substrate; and
    a chip structure comprising an integrated circuit chip and electrical contacts, said chip structure being mounted on said surface of said antenna such that a portion of said chip structure is embedded in the material of said antenna, and at least a portion of said chip structure protrudes above said surface of said antenna.

14. The transponder of claim 13, wherein said conductive material comprises a thermoplastic material having metallic particles dispersed therein.

15. The transponder of claim 13, wherein said conductive material comprises a conductive polymer.

16. The transponder of claim 15, wherein said conductive polymer comprises a thermosetting polymer having metallic particles dispersed therein.

17. The transponder of claim 15, wherein said conductive polymer comprises a thermoplastic material having metallic particles dispersed therein.

18. The transponder of claim 13, wherein said electrical contacts comprise contact pads on the chip, and further including protrusions on said contact pads.

19. The transponder of claim 18, wherein said protrusions comprise a polymer material loaded with metallic particles.

* * * * *